United States Patent [19]
Park et al.

[11] Patent Number: 5,478,766
[45] Date of Patent: Dec. 26, 1995

[54] PROCESS FOR FORMATION OF THIN FILM TRANSISTOR LIQUID CRYSTAL DISPLAY

[75] Inventors: Woonyoung Park; Seoklyul Lee, both of Seoul, Rep. of Korea

[73] Assignee: Samsung Electronics Co., Ltd., Suwon, Rep. of Korea

[21] Appl. No.: 398,120

[22] Filed: Mar. 3, 1995

[30] Foreign Application Priority Data

Mar. 3, 1994 [KR] Rep. of Korea ............... 19994-4100

[51] Int. Cl.⁶ .................................... H01L 21/786
[52] U.S. Cl. .................. 437/40; 437/51; 437/181; 437/913; 148/DIG. 105
[58] Field of Search ................ 437/40, 101, 51, 437/913, 181; 148/DIG. 105, DIG. 106

[56] References Cited

U.S. PATENT DOCUMENTS

| | | | |
|---|---|---|---|
| 4,778,560 | 10/1988 | Takeda et al. | 156/643 |
| 4,783,147 | 11/1988 | Maurice et al. | 350/333 |
| 5,008,218 | 4/1991 | Kawachi et al. | 148/DIG. 105 |
| 5,015,597 | 5/1991 | Vinouze et al. | 437/101 |
| 5,032,531 | 7/1991 | Tsutsui et al. | 437/40 |
| 5,166,085 | 11/1992 | Wakai et al. | 437/40 |
| 5,166,086 | 11/1992 | Takeda et al. | 437/101 |
| 5,231,039 | 7/1993 | Sakono et al. | 437/101 |

*Primary Examiner*—Brian Hearn
*Assistant Examiner*—Michael Trinh
*Attorney, Agent, or Firm*—Charles R. Donohoe; Stephen R. Whitt

[57] ABSTRACT

A process for formation of a thin film transistor liquid crystal display is disclosed, in which an etch-back type 3-mask process or an etch stopper type 4-mask process is applied, so that the semiconductor layer of the thin film transistor can be isolated from the data line. Consequently, the optical leakage current which aggravates the performance of the transistor is inhibited. Further, the data line is composed of a material which has a low chemical reactivity with ITO, so that a corrosion due to a chemical reaction between the data line and ITO can be eliminated.

10 Claims, 10 Drawing Sheets

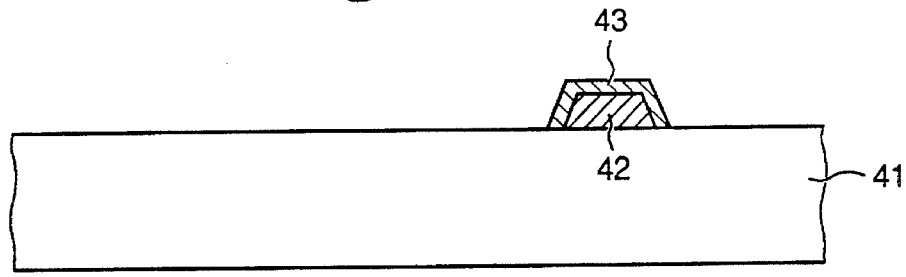
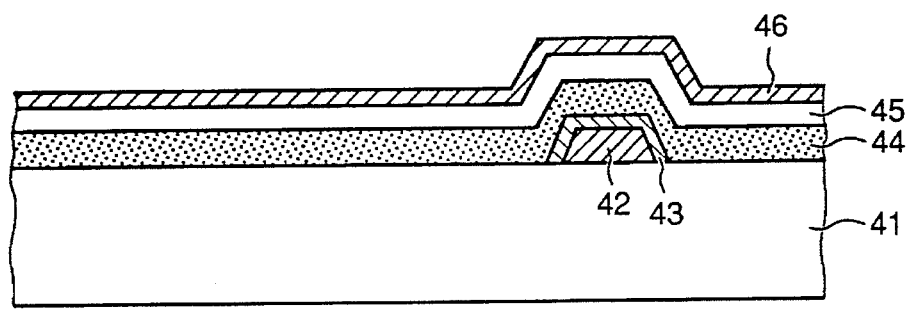
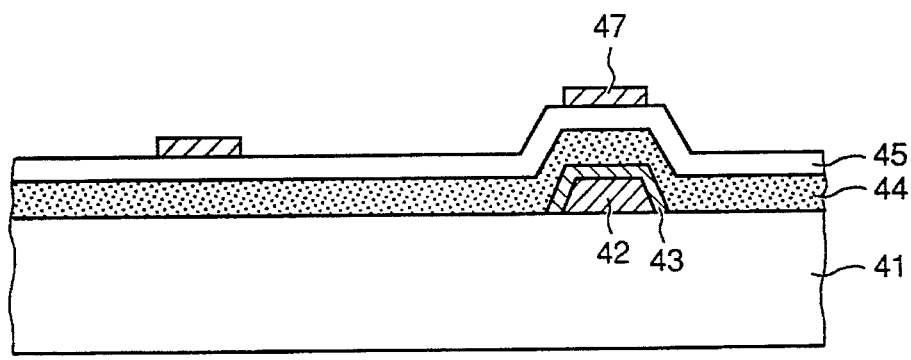

PROCESS FOR FORMATION OF THIN FILM TRANSISTOR LIQUID CRYSTAL DISPLAY

BACKGROUND OF THE INVENTION (1) Field of the invention

The present invention relates to a process for formation of thin film transistor liquid crystal display. Particularly, the present invention relates to a thin film transistor liquid crystal display and a formation process therefor, in which data lines are isolated from thin film transistors, and the data lines are made of a material having a low chemical reactivity with ITC (indium-tin oxide).

(2) Description of the prior art

Currently, the thin film transistor (TFT) liquid crystal display (LCD) has become an important class of the semiconductor device, and has been put the practical use. If the performance of the thin film transistor is to he improved, the aperture ratio has to he increased, and the length of the channel has to he shortened, so that the mobility would he improved. Meanwhile, if the productivity is to he improved, and if the production cost is to be saved, then the number of the masks which are used in the manufacturing process has to be reduced. Under this condition, it is important that the improvement of performance of the thin film transistor has to be compromised with the reduction of the number of the masks.

In the etch-back type thin film transistor, there is known a manufacturing process in which the number of masks is reduced to 2 or 3 so far, while in the etch stopper type thin film transistor, it is generally manufactured by reducing the number of masks down to 4.

The 2-mask process and the 3-mask process for the conventional etch-back type thin film transistor will be described below referring to the attached drawings.

FIG. 1A to 1E are sectional views showing the manufacturing process for a thin film transistor based on the conventional 2-mask process. This process is described in "Two-mask step-inverted staggered a-Si TFT-Addressed LCDs" (Youtaka Miya et al.), SID (Society for Information Display) 89, Digest pp 155–158.

First, as shown in FIG. 1A, a conductive material is deposited on a transparent substrate 1, and a patterning is carried out by using a first mask, thereby forming a gate electrode 2.

Then as shown in FIG. 1B, a silicon nitride layer (SiNx) 3, an intrinsic amorphous silicon layer (i-a-Si) 4 and a doped amorphous silicon layer 5 are successively deposited by applying a plasma enhanced chemical vapor deposition (PECVD) method. Then a positive photoresist is spread. Then, by using the gate electrode as a mask, ultraviolet rays are irradiated starting from the rear portion of the substrate to make the photoresist sense the rays, and then, a development is carried out.

Then as shown in FIG. 1C, by utilizing the remaining photoresist as a mask, the doped amorphous silicon layer 5 and the intrinsic amorphous silicon layer 4 are etched.

Then as shown in FIG. 1D, a metal layer is deposited, and a patterning is carried out by using a second mask, thereby forming a source electrode 6 and a drain electrode 7.

Finally, as shown in FIG. 1E, by utilizing the source electrode 6 and the drain electrode 7 as a mask, the doped amorphous silicon layer 5 is etched, thereby completing the formation of the thin film transistor.

In the above described conventional process, when the gate electrode is formed, and when the source electrode and the drain electrode are formed, one mask each is required respectively, and therefore, two masks are required in total.

However, in the above described 2-mask process, in order to form a pixel electrode, one mask has to be added, and therefore, three masks are required in actual.

Another example of the 2-mask process is U.S. Pat. No. 5,015,597, and this process is illustrated in FIG. 2.

As shown in FIG. 2, a metal layer 2, an insulating layer 3, an amorphous silicon layer 4, a doped amorphous layer 5 and another metal layer 6' are successively deposited upon a transparent substrate 1. Then a patterning is carried out by using a first mask, and then, a negative photosensitive material such as a polyimide layer 9 is spread to carry out a rear side exposure and a development. Then a transparent conductive material layer 8 composed of ITO (indium-tin oxide) or the like is deposited, and then, a pixel portion is formed by using a second mask.

Unlike the treatise of Youtaka Miya et al., the above described process completes up to the pixel portion by using two masks.

Besides the above two examples, 2-mask processes are described in U.S. Pat. Nos. 4,783,147 and 4,778,560, and in "A Self-aligned, Trilayer, a-Si:H Thin Film Transistor Prepared from Two Photomasks" by Y. Kuo, Journal of Electrochemical Society, Vol. 139, No. 4, Apr. 1992.

The above described conventional 2-mask processes have advantages such that the productivity is improved, and the production cost is saved. However, generally the switching function of the thin film transistor is not perfect, and therefore, they cannot be put to the practical use.

Because of the above described disadvantage of the 2-mask processes, a 3-mask process is preferred. Now the conventional 3-mask process used in manufacturing a thin film transistor liquid crystal display will be described referring to the attached drawings.

FIG. 3 is a sectional view showing the manufacturing process for the liquid crystal display based on a 3-mask process as presented in "A Three-mask Process for High-Mobility a-Si:H TFTs by a 14-inch AM-display (J. Glueck, E. Lueder, T. Kallfass, F. Hirschburger, and M. Brikenstein) published in Euro Display 93 AMLCD-3.

FIG. 4 illustrates the types of masks, and, in accordance with the types of FIG. 4, FIG. 3 is divided into 3A to 3C which are sectional views taken along a line A–A' while FIG. 3D is a sectional view showing a completed device.

In this process, a thin film transistor, a pixel electrode and a storage capacitor are formed by using three masks.

First, a metal such as chrome (Cr) is deposited upon a transparent substrate, and then, a patterning is carried out as shown in FIG. 4A. Thus, a gate line, a gate electrode 2 connected to the gate line, and a storage capacitor lower electrode 10 are formed. Then a silicon nitride layer 3, an amorphous silicon layer 4 and an n+ doped amorphous silicon layer 5 are successively formed by applying a PECVD method, thereby forming a silicon triple layers as shown in FIG. 3A.

Then, a chrome/aluminum (Cr/Al) layer is deposited, and then, as shown in FIG. 4B, a patterning is carried out, thereby forming a first longitudinal data line 6' and a storage capacitor upper electrode 11. Then, by using the chrome/aluminum layer as a mask, the n+ doped amorphous silicon layer 5 and the amorphous silicon layer 4 are etched within a CF4/O2 plasma, so that the structure of FIG. 3B would be formed.

Then an ITO layer is deposited, and then, a patterning is carried out as shown in FIG. 4C, so that a second longitudinal data line 12 and a pixel portion 13 would be formed as shown in FIG. 3C. Finally by using the remaining ITO layer as a mask, the chrome/aluminum layer 6' and the n+ doped amorphous silicon layer 5 are etched, so that a source electrode 6 connected to the data line, a drain electrode 7 connected to the pixel electrode, and a contact layer would be formed. Then, a silicon nitride layer 14 is deposited, thereby competing a liquid crystal display as shown in FIG. 3D.

However, in the above described conventional liquid crystal display which is manufactured by applying the etch-back type 3-mask process, as shown in FIGS. 4B and 4C, there are elongate triple silicon layers containing an amorphous silicon which generates an optical current leakage upon being irradiated by light. These triple silicon layers are lying under the data line, and therefore, if light is irradiated from the rear portion of the substrate, then the optical current leakage is greatly increased, with the result that the off current of the thin film transistor is increased. Further, the source electrode, the drain electrode and the data line are composed of aluminum which is chemically reacted with ITO. Therefore, due to the chemical corrosion of aluminum and ITO, a wiring defect can occur.

Further, the above described disadvantages of the conventional technique occur in a 4-mask process in the same way.

SUMMARY OF THE INVENTION

The present invention is intended to overcome the above described disadvantages of the conventional techniques.

Therefore it is the object of the present invention to provide a process for formation of a thin film transistor liquid crystal display, in which the semiconductor of a thin film transistor is isolated from a data line in an etch-back type 3-mask process or 4-mask process so as to inhibit an optical current leakage, and the data line is composed of a material having a low reactivity with ITO.

In achieving the above object, the process for formation of the thin film transistor liquid crystal display according to the present invention includes the steps of:

depositing a conductive material upon a transparent substrate, and patterning it to form a gate line and a gate electrode connected to the gate line;

depositing an insulating material, a semiconductor material and a doped semiconductor material upon the substrate in a successive manner to cover the gate line and the gate electrode, so as to form a triple-layer composed of a insulating layer, a semiconductor layer and a doped semiconductor layer;

depositing a metal upon the triple-layer, and patterning it to cover the gate electrode, so as to form a source/drain metal layer upon the triple-layer, and to form a data line isolated from the source/drain metal layer;

etching the doped semiconductor layer and the semiconductor layer by using the source/drain metal layer and the data line as a mask;

depositing and patterning a transparent conductive material to form a data line portion and a pixel portion, the data line portion covering a part of the source/drain metal layer and the data line to connect them, the pixel portion covering another part of the source/drain metal layer and a part of an exposed portion of the insulating layer, and the pixel portion being isolated from the data line portion; and etching the source/drain metal layer and the doped semiconductor layer by using the data line portion and the pixel portion as a mask, thereby forming a source electrode, a drain electrode and a contact layer.

In another aspect of the present invention, the process for formation of the thin film transistor liquid crystal display according to the present invention includes the steps of:

depositing a conductive material upon a transparent substrate, and patterning it to form a gate line and a gate electrode connected to the gate line;

successively depositing an insulating material, a semiconductor material and an insulating material in such a manner as to cover the gate line and the gate electrode, to form a triple-layer consisting of a first insulating layer, a semiconductor layer and a second insulating layer;

patterning the second insulating layer to form an etch stopper, the etch stopper covering the gate electrode and being disposed on the triple-layer;

depositing a doped semiconductor layer on the etch stopper and on the semiconductor layer to form a doped semiconductor layer, depositing a metal on the doped semiconductor layer to form a metal layer, and patterning the metal layer to form a source/drain metal layer and a data line, the source/drain metal layer covering the etch stopper, and the data line being isolated from the source/drain metal layer;

etching the doped semiconductor layer and the semiconductor layer by using the source/drain metal layer and the data line as a mask;

depositing a transparent conductive material, and patterning it to form a data line portion and a pixel portion, the data line portion covering a part of the source/drain metal layer and the data line to connect them, and the pixel portion covering another part of the source/drain metal layer and a part of an exposed portion of the insulating layer, and the pixel portion being isolated from the data line portion; and etching the source/drain metal layer and the doped semiconductor layer by using the data line portion and the pixel portion as a mask, thereby forming a source electrode, a drain electrode and a contact layer.

BRIEF DESCRIPTION OF THE DRAWINGS

The above object and other advantages of the present invention will become more apparent by describing in detail the preferred embodiment of the present invention with reference to the attached drawings in which:

FIGS. 7A to 7F are sectional views showing another embodiment of the process for manufacturing the thin film transistor liquid crystal display according to the present invention.

DESCRIPTION OF THE PREFERRED EMBODIMENTS

An embodiment of the process of the present invention will be described referring to the attached drawings, in such a manner that those ordinarily skilled in the art can easily understand.

Figure 1A:
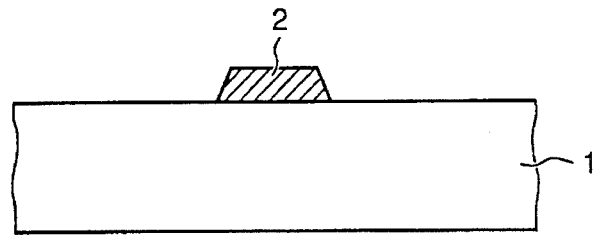
FIGS. 1A to 1E are sectional views showing a process for manufacturing a thin film transistor liquid crystal display based on a conventional 2-mask process.
Figure 1B:
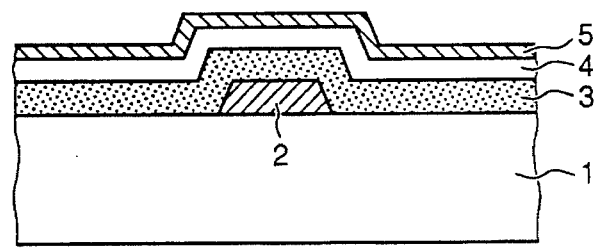
Figure 1C:
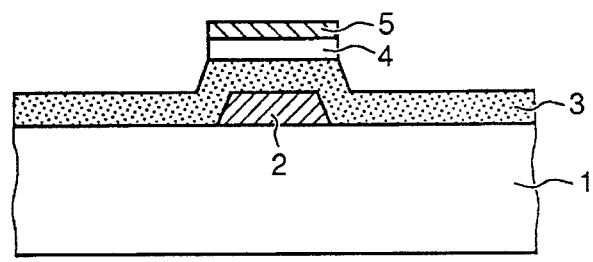
Figure 1D:
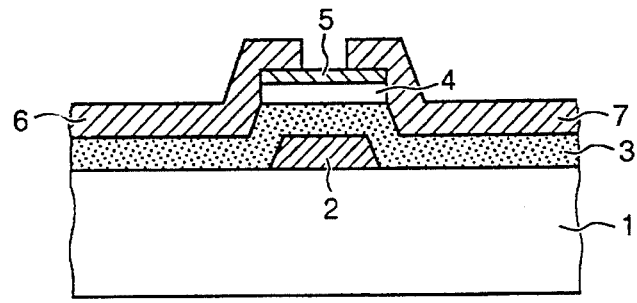
Figure 1E:
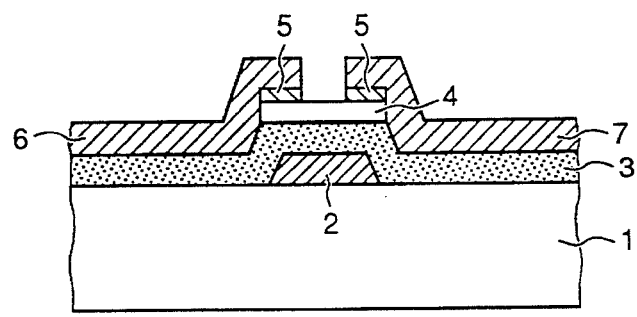
Figure 2:
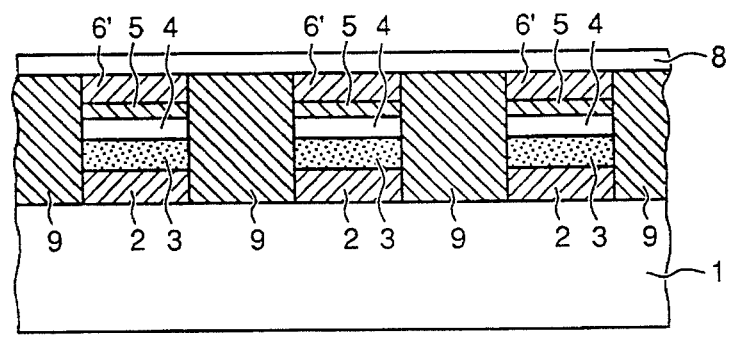
FIG. 2 is a sectional view of a thin film transistor manufactured based on another conventional 2-mask process.
Figure 3A:
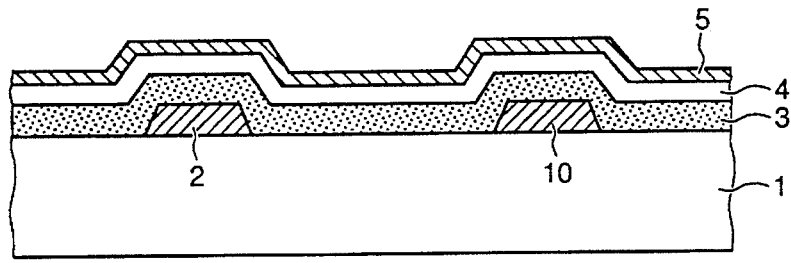
FIGS. 3A to 3D are sectional views showing a process for manufacturing a thin film transistor liquid crystal display based on a conventional 3-mask process.
Figure 3B:
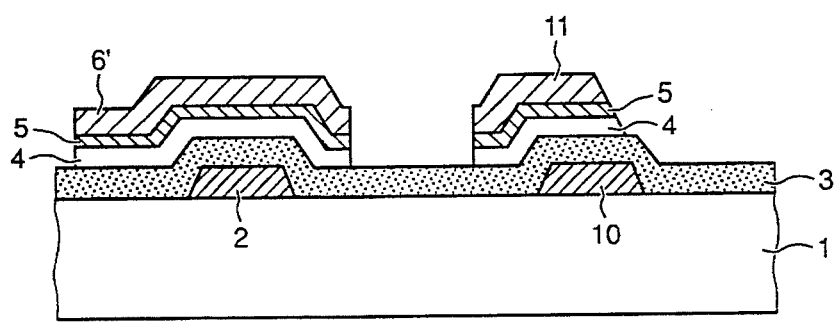
Figure 3C:
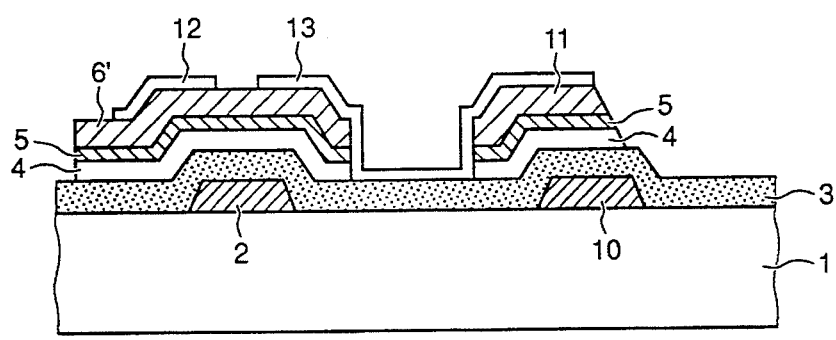
Figure 3D:
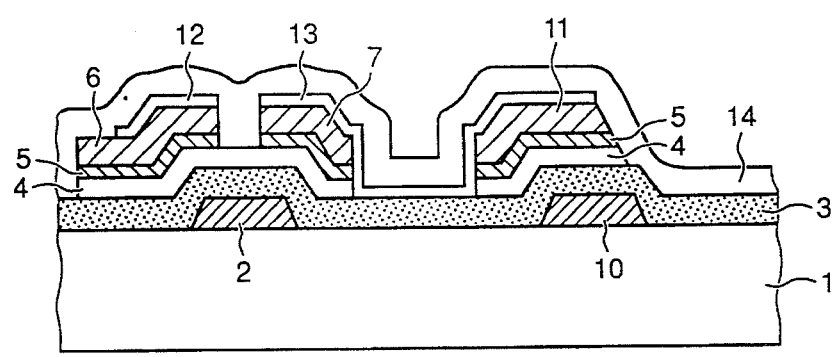
Figure 4A:
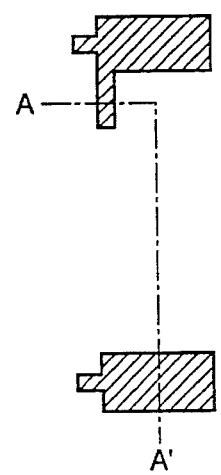
FIGS. 4A to 4C illustrate types of the masks used in the conventional process of FIG. 3.
Figure 4B:
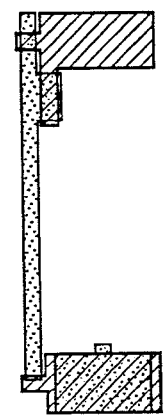
Figure 4C:
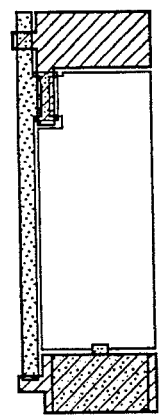
Figure 5A:
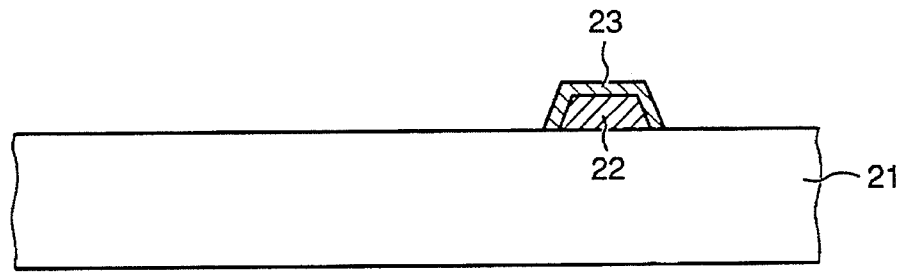
FIGS. 5A to 5E are sectional views showing an embodiment of the process for manufacturing the thin film transistor liquid crystal display according to the present invention.
Figure 5B:
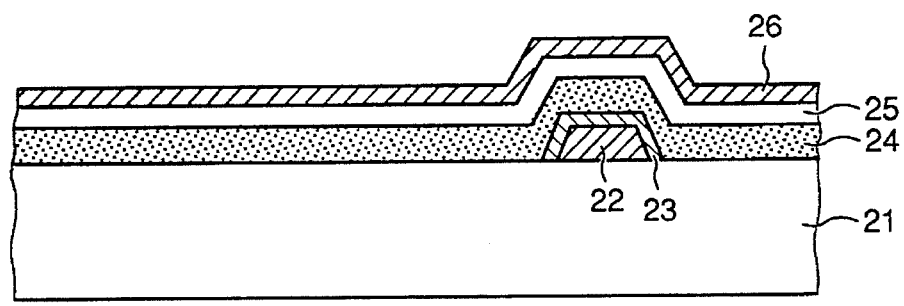
Figure 5C:
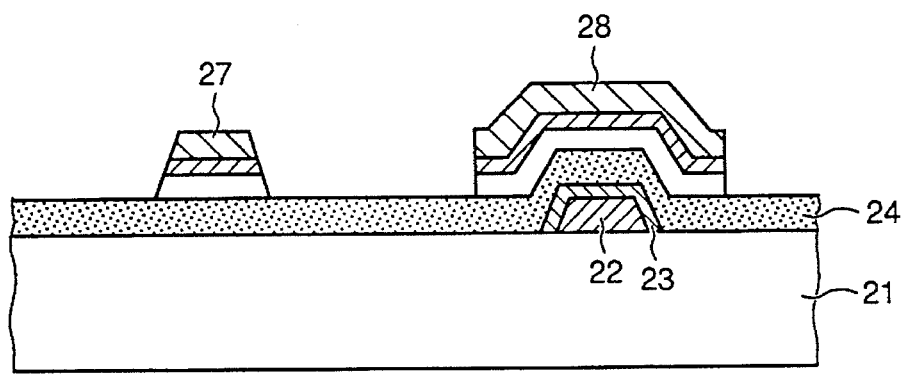
Figure 5D:
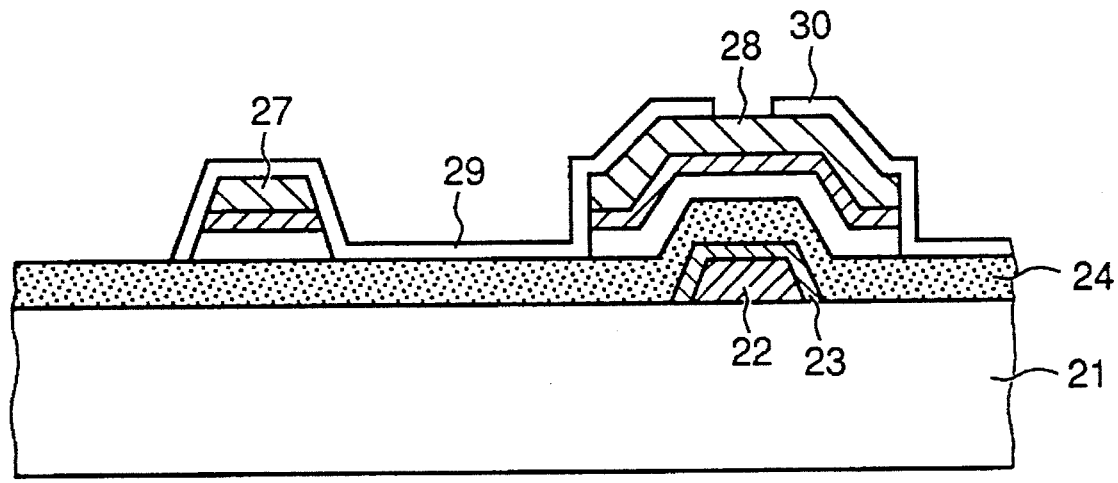

FIGS. 5A to 5E are sectional views showing an embodiment of the process for manufacturing the thin film transistor liquid crystal display according to the present invention. FIGS. 6A to 6C illustrate types of the masks used in manufacturing the thin film transistor liquid crystal display of FIG. 5. FIGS. 5A to 5E are sectional views taken along a line B–B' of FIG. 6.

Figure 5E:
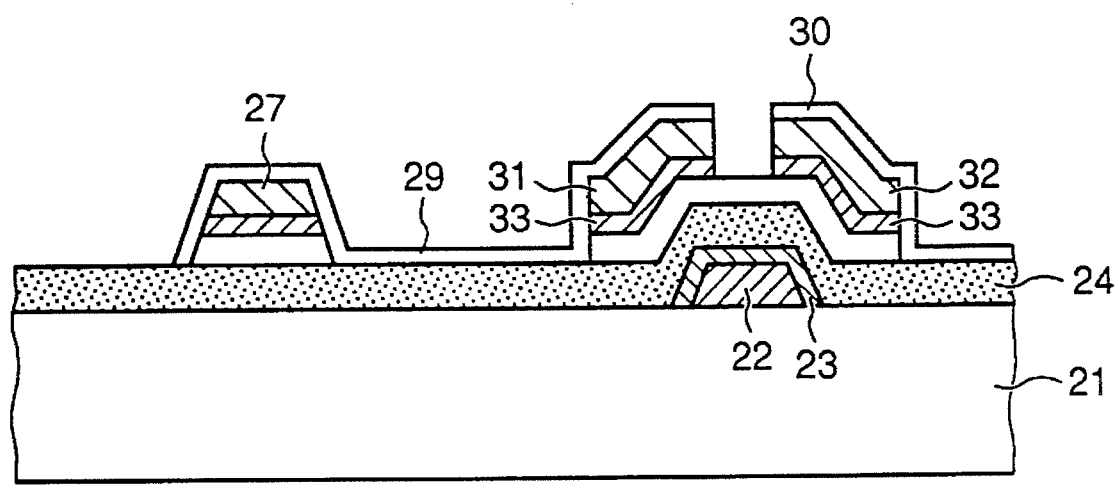
Figure 6A:
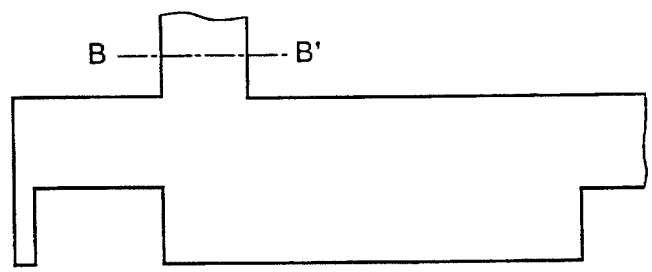
FIGS. 6A to 6C illustrate the types of the masks used in manufacturing the thin film transistor liquid crystal display of FIG. 5.
Figure 6B:
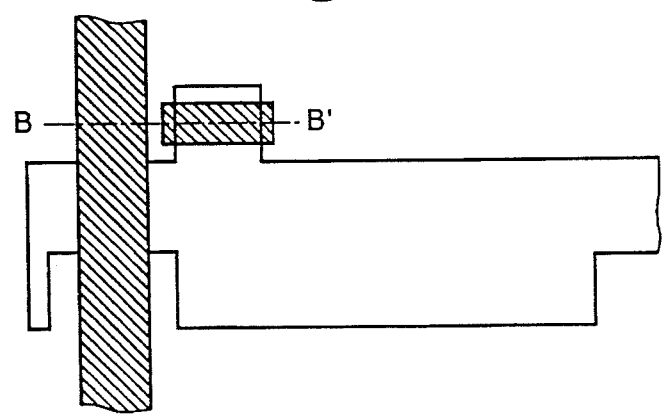
Figure 6C:
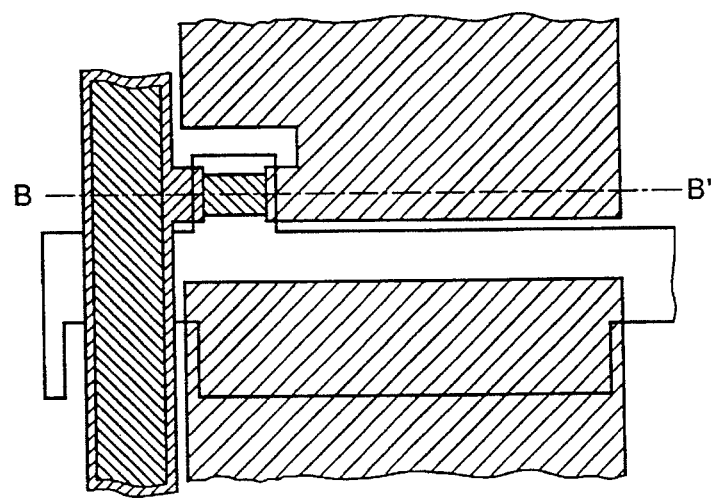

As shown in FIG. 5E, in the liquid crystal display of this embodiment based on a 3-mask process, a semiconductor layer of the thin film transistor is isolated from a data line, but is connected to only an ITO layer, so that an optical current leakage weakening the performance of the transistor can be inhibited.

Now this process will be described in detail referring to FIGS. 5 and 6.

First, a gate metal layer is deposited upon a transparent substrate 21, and a patterning is carried out as shown in FIG. 6A, thereby forming a gate line and a gate electrode 22 connected to the gate line as shown in FIG. 5A. Under this condition, in the case where the metal of the gate metal layer is anode-oxidized, an anode oxidation process is added to form a gate insulating layer 23. In the case where the metal of the gate metal layer belongs to tantalum (Ta) series, Ta2O5 is formed after the anode oxidation. In the case where it aluminum, Al2O3 is formed.

Then as shown in FIG. 5B, three layers, i.e., an insulating layer 24, a semiconductor layer 25 and a doped semiconductor layer 26 are deposited upon the transparent substrate 21, in such a manner that the gate electrode 22 would be covered. The insulating layer 24 is composed of silicon nitride or silicon oxide (SiOx), the semiconductor layer 25 is composed of an amorphous silicon, and the doped semiconductor layer 26 is composed of an n+ doped amorphous silicon. All of them are deposited by applying a CVD method.

Then a metal such as chrome, titanium (Ti), molybdenum (Mo) or tantalum (Ta), which have a low chemical reactivity with ITO, is deposited, thereby forming a second metal layer.

Then a patterning is carried out as shown in FIG. 6B, to form a data line 27, and a source/drain metal layer 28 which is isolated from the former.

Then, the doped semiconductor layer 26 and the semiconductor layer 25 are etched by using the remaining metal layer as a mask, so that the thin film transistor would be isolated from the data line as shown in FIG. 5D. In this process, the triple-layer of the thin film transistor, particularly the semiconductor layer using basically an amorphous silicon, which generates an optical current leakage upon being irradiated by light, minimally extends to the outside of the gate electrode, thereby reducing the optical current leakage.

Then, ITO is deposited, and a patterning is carried out as shown in FIG. 6C, so that a data line portion 29 and a pixel portion 30 would be formed as shown in FIG. 5D.

The data line portion 29 surrounds the data line, and at the same time, extends toward a source electrode which is to be formed later.

Finally, as shown in FIG. 5E, the source/drain metal layer 28 and the doped semiconductor layer 26 are etched by using the remaining ITO layer as a mask so as to form a source electrode 31, a drain electrode 32 and a contact layer 33, thereby completing the present invention.

Figure 7D:
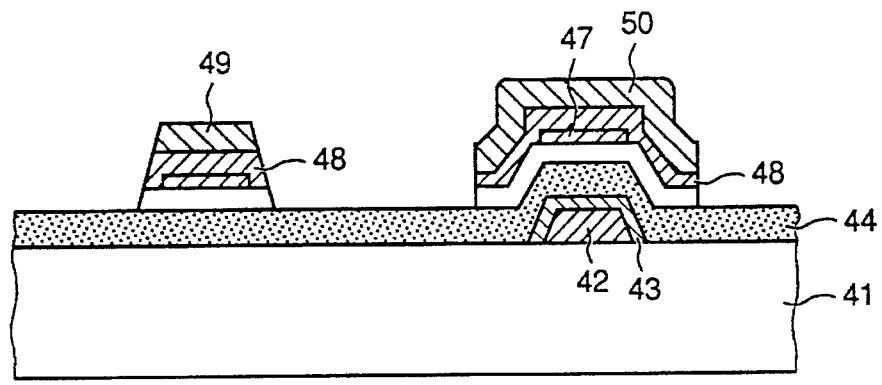
Figure 7E:
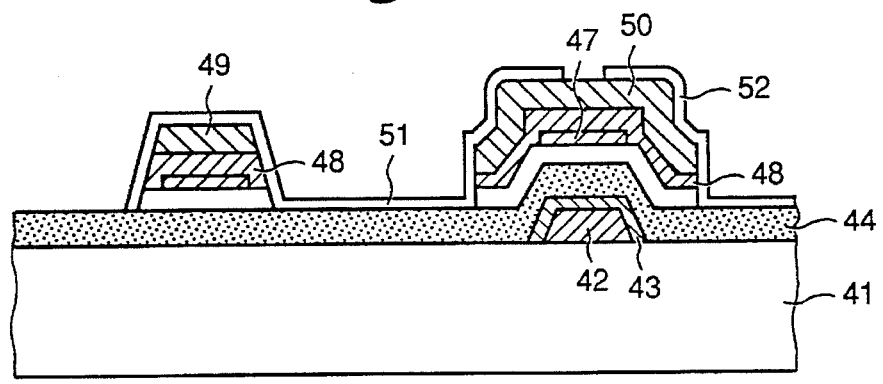

FIGS. 7A to 7F are sectional views showing another embodiment of the process for manufacturing the etch stop type thin film transistor liquid crystal display according to the present invention. FIGS. 8A to 8C illustrate types of the masks used in manufacturing the thin film transistor liquid crystal display of FIG. 7. FIGS. 7A to 7F are sectional views taken along a line C–C' of FIG. 8.

Figure 7F:
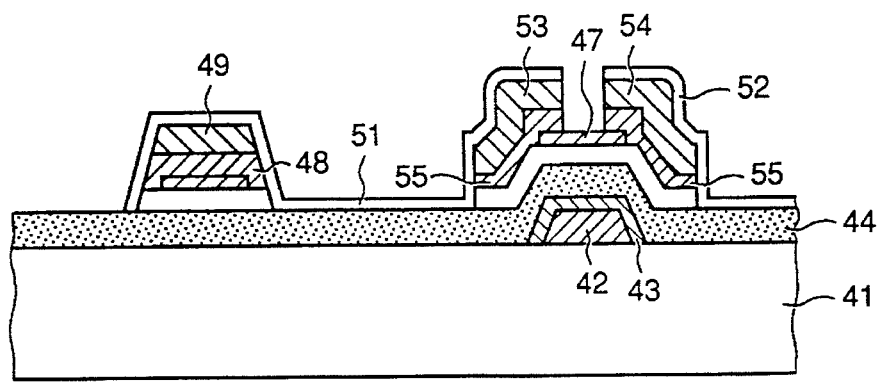
Figure 8A:
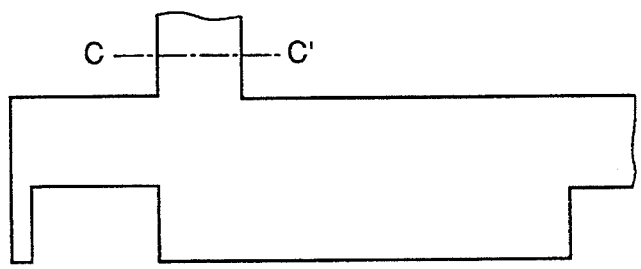
FIGS. 8A to 8D illustrate the types of the masks used in manufacturing the thin film transistor liquid crystal display of FIG. 7.
Figure 8B:
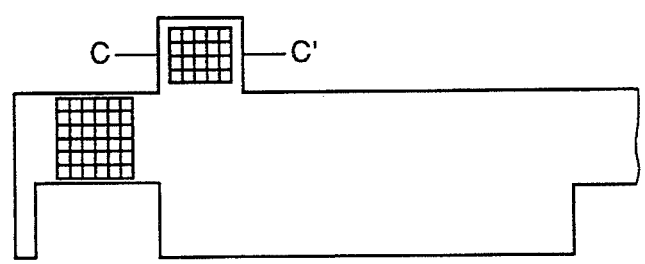
Figure 8C:
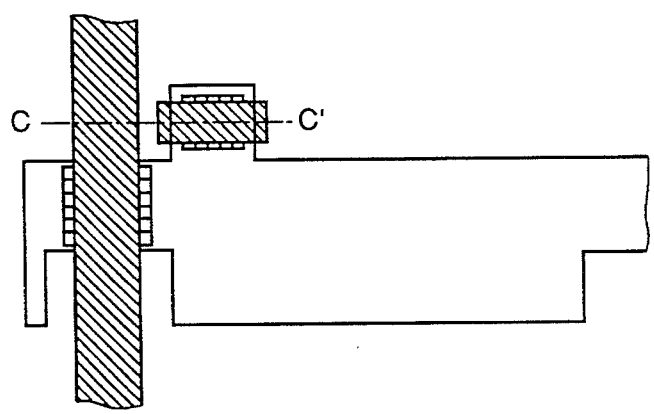
Figure 8D:
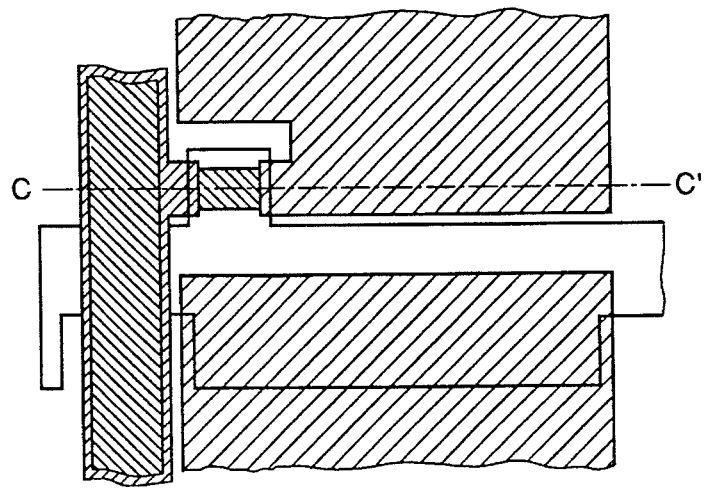

As shown in FIG. 7F, like in the etch-back type 3-mask process, in the liquid crystal display manufactured by applying the 4-mask process, the semiconductor layer of the thin film transistor is isolated from the metal layer of the data line, and the semiconductor layer of the thin film transistor is connected to only the ITO layer. Consequently, the optical leakage current which aggravates the performance of the transistor can be inhibited.

Now this process will be described in further detail referring to FIGS. 7 and 8. First, a gate metal layer is deposited upon a transparent substrate 41, and then, a patterning is carried out as shown in FIG. 8A. Then as shown in FIG. 7A, a gate line and a gate electrode 42 connected to the gate line are formed. In the case where the metal used in the gate metal layer can be anode-oxidized, an anode oxidation process is added, thereby forming a gate insulating layer 43. In the case where the metal used for the gate metal layer belongs to tantalum (Ta) series, Ta2O5 is formed after the anode oxidation, while in the case where it is aluminum, Al2O3 is formed.

Then as shown in FIG. 7B, a triple-layer consisting of a first insulating layer 44, a semiconductor layer 45 and a second insulating layer 46 is formed upon the transparent substrate 41, in such a manner that the triple-layer would cover the gate electrode 42. The first insulating layer and the second insulating layer 46 are composed of silicon nitride, and the semiconductor layer 45 is composed of amorphous silicon, while all the three layers are deposited by applying a CVD method.

Then a positive photoresist is spread on the second insulating layer 46, and then, an exposure and a development are carried out as shown in FIG. 8B. Then the second insulating layer 46 is etched by utilizing the remaining photoresist as a mask, so that an etch stopper 47 would be formed as shown in FIG. 7C.

Then an n+ doped amorphous silicon is deposited to form a doped semiconductor layer 48. Then a metal such as chrome, titanium, molybdenum, tantalum or the like which has a low chemical reactivity with ITO is deposited, thereby forming a second metal layer. Then as shown in FIG. 8B, the second metal layer is patterned so as to form a data line 49 and a source/drain metal layer 50 which is isolated from the data line 49. Then the doped semiconductor layer 48 and the semiconductor layer 45 are etched by utilizing the remaining metal layer as a mask, so that the thin film transistor would be isolated from the data line as shown in FIG. 7D. In the above described process, the semiconductor layer of the thin film transistor which is basically composed of an amorphous silicon which generates an optical leakage current upon being exposed to light rays is prevented from being extended to the outside of the gate electrode. Or at least, the extension is minimized, and therefore, the optical leakage current which aggravates the performance of the transistor is reduced.

Then an ITO layer is deposited, and then, a patterning is carried out as shown in FIG. 8C, so that a data line portion 51 and a pixel portion 52 can be formed as shown in FIG. 7E.

The data line portion 51 surrounds the data line, and extends toward the source electrode which is to be formed later. Meanwhile, the pixel portion 52 forms a pixel electrode, and extends toward a drain electrode which is to be formed later.

Finally as shown in FIG. 7F, the source/drain metal layer 50 and the doped semiconductor layer 48 are etched by using the remaining ITO layer as a mask to form a source electrode 53, a drain electrode 54 and a contact layer 55, thereby completing the process of the present invention.

According to the present invention as described above, an etch-back type 3-mask process or an etch stopper type 4-mask process is applied, so that the semiconductor layer of the thin film transistor can be isolated from the data line. Consequently, the optical leakage current which aggravates the performance of the transistor is inhibited. Further, the data line is composed of a material which has a low chemical reactivity with ITO, so that a corrosion due to a chemical reaction between the data line and ITO can be eliminated.

What is claimed is:

1. A process for formation of a thin film transistor liquid crystal display, comprising the steps of:

depositing a conductive material upon a transparent substrate, and patterning it to form a gate line and a gate electrode connected to said gate line;

depositing an insulating material, a semiconductor material and a doped semiconductor material upon said substrate in a successive manner to cover said gate line and said gate electrode, so as to form a triple-layer composed of a insulating layer, a semiconductor layer and a doped semiconductor layer;

depositing a metal upon said triple-layer, and patterning it to cover said gate electrode, to form a source/drain metal layer upon said triple-layer, and to form a data line isolated from said source/drain metal layer;

etching said doped semiconductor layer and said semiconductor layer by using said source/drain metal layer and said data line as a mask;

depositing and patterning a transparent conductive material to form a data line portion and a pixel portion, said data line portion covering a part of said source/drain metal layer and said data line to connect them, said pixel portion covering another part of said source/drain metal layer and a part of an exposed portion of said insulating layer, and said pixel portion being isolated from said data line portion; and etching said source/drain metal layer and said doped semiconductor layer by using said data line portion and said pixel portion as a mask, thereby forming a source electrode, a drain electrode and a contact layer.

2. The process as claimed in claim 1, furthering comprising the step of oxidizing said gate line and said gate electrode, between the step of forming said gate line and said gate electrode and the step of forming said triple-layer.

3. The process as claimed in any one of claims 1 and 2, wherein said insulating material is silicon nitride or silicon oxide.

4. The process as claimed in claim 1, wherein said insulating layer consists of two layers composed of silicon nitride and silicon oxide respectively.

5. The process as claimed in any one of claims 1, 2 and 4, wherein the metal deposited on said triple-layer is one selected from among chrome, titanium, molybdenum, and tantalum.

6. A process for formation of a thin film transistor liquid crystal display, comprising the steps of:

depositing a conductive material upon a transparent substrate, and patterning it to form a gate line and a gate electrode connected to said gate line;

successively depositing an insulating material, a semiconductor material and an insulating material in such a manner as to cover said gate line and said gate electrode, to form a triple-layer consisting of a first insulating layer, a semiconductor layer and a second insulating layer;

patterning said second insulating layer to form an etch stopper, said etch stopper covering said gate electrode and being disposed on said triple-layer;

depositing a doped semiconductor layer on said etch stopper and on said semiconductor layer to form a doped semiconductor layer, depositing a metal on said doped semiconductor layer to form a metal layer, and patterning said metal layer to form a source/drain metal layer and a data line, said source/drain metal layer covering said etch stopper, and said data line being isolated from said source/drain metal layer;

etching said doped semiconductor layer and said semiconductor layer by using said source/drain metal layer and said data line as a mask;

depositing a transparent conductive material, and patterning it to form a data line portion and a pixel portion, said data line portion covering a part of said source/drain metal layer and said data line to connect them, and said pixel portion covering another part of said source/drain metal layer and a part of an exposed portion of said insulating layer, and said pixel portion being isolated from said data line portion; and etching said source/drain metal layer and said doped semiconductor layer by using said data line portion and said pixel portion as a mask, thereby forming a source electrode, a drain electrode and a contact layer.

7. The process as claimed in claim 6, furthering comprising the step of oxidizing said gate line and said gate electrode, between the step of forming said gate line and said gate electrode and the step of forming said triple-layer.

8. The process as claimed in any one of claims 6 and 7, wherein said first insulating layer and said second insulating layer are composed of silicon nitride or silicon oxide.

9. The process as claimed in claim 6, wherein each of said first insulating layer and said second insulating layer consists of two layers composed of silicon nitride and silicon oxide.

10. The process as claimed in any one of claims 6, 7 and 9, wherein said metal layer is composed of a metal selected from among chrome, titanium, molybdenum and tantalum.

* * * * *